United States Patent [19]

Onishi

[11] Patent Number: 5,379,718

[45] Date of Patent: Jan. 10, 1995

[54] METHOD FOR FORMING A TITANIUM THIN FILM

[75] Inventor: Shigeo Onishi, Nara, Japan

[73] Assignee: Sharp Kabushiki Kaisha, Osaka, Japan

[21] Appl. No.: 151,427

[22] Filed: Nov. 15, 1993

[30] Foreign Application Priority Data

Dec. 25, 1992 [JP] Japan ................................. 4-347084

[51] Int. Cl.6 ............................................. C30B 29/54
[52] U.S. Cl. ..................................................... 117/88
[58] Field of Search ............... 156/610, 612, DIG. 75; 524/423, 427

[56] References Cited

U.S. PATENT DOCUMENTS

| | | | |
|---|---|---|---|
| 4,346,131 | 8/1982 | Yoldas | 428/35 |
| 4,361,598 | 11/1982 | Yoldas | 427/74 |
| 4,802,740 | 2/1989 | Hotta et al. | 350/341 |
| 4,859,492 | 8/1989 | Rogers, Jr. et al. | 427/42 |
| 5,008,149 | 4/1991 | Taga et al. | 428/336 |
| 5,130,172 | 7/1992 | Hicks et al. | 427/252 |
| 5,273,783 | 12/1993 | Wanner | 427/250 |

FOREIGN PATENT DOCUMENTS

| | | |
|---|---|---|
| 63-278352 | 11/1988 | Japan . |
| 1-290771 | 11/1989 | Japan . |
| 2-15620 | 1/1990 | Japan . |
| 2-157123 | 6/1990 | Japan . |
| 2-210833 | 8/1990 | Japan . |
| 3-248464 | 11/1991 | Japan . |

Primary Examiner—R. Bruce Breneman
Assistant Examiner—Felisa Garrett
Attorney, Agent, or Firm—Nixon & Vanderhye

[57] ABSTRACT

A method for producing a titanium thin film comprises: forming the titanium thin film on a substrate in the presence of water vapor gas by CVD method which uses a material gas containing an organic titanium compound having an aliphatic alkoxide or an aliphatic diketone as a ligand.

6 Claims, 2 Drawing Sheets

METHOD FOR FORMING A TITANIUM THIN FILM

BACKGROUND OF THE INVENTION

1. Field of the Invention

The invention relates to a method for forming a titanium thin film, more particularly to a method for forming a titanium thin film by CVD method.

2. Description of the Related Art

Titanium and titanium alloy have been conventionally used for a wiring or contact portion of semiconductive devices. Especially, they play an important role in the contact portion. For example, titanium (Ti) and titanium silicide ($TiSi_x$) are known as a contact metal material capable of forming an excellent contact because of their low resistance. Titanium nitride ($TiN_x$) is well known as a barrier metal material having a high barrier. Sputtering method and CVD method are well known as a technique for forming a thin film of such materials. In case of forming a titanium film, sputtering methods are generally used.

In recent years, a diameter of contact portion has been reduced in accordance with minimization of semiconductive devices, and a thickness of interlayer insulating film has been increased for planalization of the device. Accordingly, the shape of the contact hole has been changed to be great in depth and small in diameter, in other words, an aspect ratio of the contact hole has been increased. In such a contact portion, it is necessary to form a titanium film with sufficient thickness at the bottom of the contact hole in order to realize a good contact with titanium. However, good coverage and the film with a sufficient thickness at the bottom of the contact hole was not obtained by the conventional sputtering method for forming a titanium thin film. Further, as seen from FIG. 3, an over-hang 14 of titanium thin film 13 may be formed in a contact hole 12a of $SiO_2$ film 12 extending to a silicon substrate 1. When titanium thin film 13 was embedded in the contact hole 12a, a void 15 may occur owing to the over-hang 14 as shown in FIG. 4. This is a problem for embedding the titanium film 13 into the contact hole 12a.

Under these circumstance, a method for forming a titanium thin film using CVD methods, which can provide good coverage, has been developed. However, there are several drawbacks of forming a titanium thin film in a contact hole by the use of titanium tetrachloride that is generally known as a material gas for forming a titanium thin film.

In the process for forming a titanium thin film, a substrate needs to be heated. Heating the substrate to a level of a decomposition temperature of titanium tetrachloride (about 900° C. or more) results in too much elevated temperature in the substrate, whereby reaction between Ti and Si can not be controlled. Besides, aluminum alloy as used for wiring may be melted at such heating. Employing plasma energy in place of thermal energy deteriorates the coverage in CVD method. In addition, using titanium tetrachloride as material gas results in a titanium film containing chlorine (Cl). In other words, using titanium tetrachloride has a drawback of allowing wirings to be corroded owing to the difficulty of impeding the infiltration of chlorine content in the titanium film when using aluminum alloy as wirings in the subsequent process.

In this way, the CVD method using titanium tetrachloride has difficulties in producing a titanium thin film with only a small amount of impurities, with good coverage, and at low temperature.

Further, a method using CVD technique with an organic compound as materials has been developed for forming a silicon oxide thin film and titanium nitride film because organic compounds has relatively low decomposition temperature. For example, a method for forming a film of organic compound, which is a solid or liquid state at room temperature, using vapor pressure at a temperature lower than the decomposition of the organic compound is proposed. Japanese Unexamined Patent Publication 1-290771/1989 discloses a method for forming a titanium thin film by thermal decomposition of organic titanium compounds formed of an organic compound having a cyclic structure and titanium connected to a $\pi$-electron of the organic compound. The organic titanium compounds used for forming titanium thin film as a material gas rarely have a sufficient vapor pressure at a temperature lower than decomposition. On the other hand, various organic titanium compounds, especially organic compounds having a cyclic structure, is very unstable and difficult to treat. Further, there is a defect that organic compounds are left in the titanium thin film after the decomposition, thereby making it difficult to form a titanium thin film with only a few amount of impurities. Thus, the method for forming a titanium thin film by CVD method has not sufficiently improved.

SUMMARY OF THE INVENTION

The present invention is made in order to solve the above problems. The object of the present invention is to provide a method for forming a titanium thin film without difficulty at low temperature, with good coverage and a few amount of impurities.

The present invention provides a method for producing a titanium thin film comprising: forming the titanium thin film on a substrate in the presence of water vapor gas by CVD method which uses a material gas containing a titanium alkoxide or an organic titanium compound having an aliphatic diketone as a ligand.

DETAILED DESCRIPTION OF THE INVENTION

The substrates used in the present invention may be those generally used for forming semiconductive devices such as silicon substrate or compound semiconductor, and is not specifically limited. Examples of compound semiconductor substrates include GaAs, AlGaAs, InAlAs, InGaAs, InGaAsP or InP. Titanium thin film can be directly formed thereon. Alternatively, it may be formed after forming desired elements such as transistor and capacitor on the substrate and interlayer insulating film. Alternatively, after forming interlayer insulating film on the substrate followed by forming a desired contact hole in the interlayer insulating film, the titanium thin film may be formed on the substrate including the contact hole.

The organic titanium compounds having an aliphatic alkoxide or an aliphatic diketone as a ligand are used as a material gas for forming a titanium thin film.

Examples of the titanium alkoxide of the present invention include titanium isopropoxide [Ti(i-C$_3$H$_7$O)$_4$], titanium ethoxide [Ti(C$_2$H$_5$O)$_4$], titanium n-butoxide [Ti(n-C$_4$H$_9$O)$_4$], titanium t-butoxide[Ti(t-C$_4$H$_9$O)$_4$]. Among them, titanium isopropoxide is preferable.

In the organic titanium compounds having an aliphatic diketone as a ligand, any aliphatic diketone can be used for a ligand as far as it may form a complex with titanium. Examples of the aliphatic diketones to be used as a ligand include: acethylacetone (CH$_3$COCH$_2$COCH$_3$), 2,2,6,6-tetramethyl-3,5-heptandione [(CH$_3$)$_3$CCOCH$_2$COC(CH$_3$)$_3$], 3,3,7,7-tetraethyl-4,6-nonanedione [CH$_3$CH$_2$C(C$_2$H$_5$)$_2$COCH$_2$COC(C$_2$C$_5$)$_2$CH$_2$CH$_3$], 3-methyl-2,4-pentandione [CH$_3$COCH(CH$_3$)COCH$_3$], 3-ethyl-2,4-pentandione [CH$_3$COCH(C$_2$C$_5$)COCH$_3$], 2,2,4,6,6-pentamethyl-3,5-heptandione [(CH$_3$)$_3$CCOCH(CH$_3$)COC(CH$_3$)$_3$], 2,2,6,6-tetramethyl-4-ethyl-3,5-heptandione [(CH$_3$)$_3$CCOCH(C$_2$C$_5$)COC(CH$_3$)$_3$], 3,3,5,7,7-pentaethyl-4,6-nonanedione [CH$_3$CH$_2$C(C$_2$C$_5$)$_2$COCH(C$_2$C$_5$)COC(C$_2$C$_5$)$_2$CH$_2$CH$_3$], 3,3,7,7-tetraethyl-5-methyl-4,6-nonanedione [CH$_3$CH$_2$C(C$_2$C$_5$)$_2$COCH(CH$_3$)COC(C$_2$C$_5$)$_2$CH$_2$CH$_3$], acetonitrile acetone (CH$_3$COCH$_2$CH$_2$COCH$_3$), 2,6-heptandione [CH$_3$CO(CH$_2$)$_3$COCH$_3$]. Preferably, 2,2,6,6-tetramethyl-3,5-heptandione is used.

Figure 2:
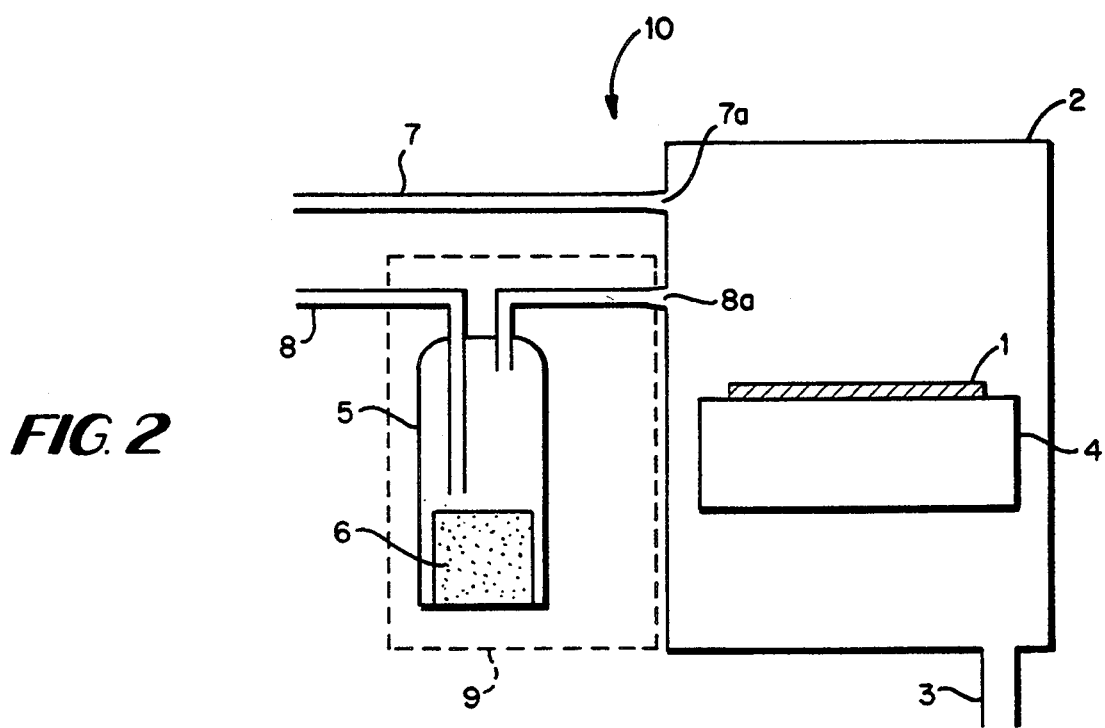
FIG. 2 is a schematic cross sectional view showing essential part of CVD apparatus used in the present invention.

The CVD apparatus of the present invention may be those used for general formation of thin film such as thermal CVD apparatus or plasma CVD apparatus which are used for CVD method conducted under reduced pressure, and is not limited to a specific type. For example, FIG. 2 shows a thermal CVD apparatus. The CVD apparatus 10 contains a reaction chamber 2 provided with substrate holding means 4 in which heating means (not shown) is included. On the side surface of the reaction chamber 2, a first inlet port 7a and a second inlet port 8a are formed for introducing gas into the reaction chamber 2. To the first inlet port 7a is connected to a first inlet pipe 7 while to the second inlet port 8a is connected to a second inlet pipe 8. On the opposite side of the first and the second inlet ports 7a and 8a in the reaction chamber 2 is formed a outlet port 3. Further, the second inlet pipe 8 is connected to a cylinder 5 for supplying material gas 6. The second inlet pipe 8 and the cylinder 5 are kept at a desired temperature in a constant temperature tank 9.

In the process of forming the titanium film using such a device, a cylinder containing the material gas is initially kept at a temperature ranging from 0° to 150° C. in the constant temperature tank. The optimal temperature is determined depending on the kind of material gas actually employed in this process. For example, in the case of titanium isopropoxide [Ti(i-C$_3$H$_7$O)$_4$], the optimal temperature is set to about 30° to 60° C. In the case of titanium 2,2,6,6-tetramethyl-3,5-heptandione [Ti(THD)$_4$] (THD: 2,2,6,6-tetramethyl-3,5-heptandione), the optimal temperature is preferably set to about 100° to 150° C. The second inlet port connected the cylinder with the film forming chamber is also kept at the temperature similar to the cylinder, preferably 10° to 20° C. higher than the temperature of the cylinder.

It is preferable that an active gas such as oxygen is eliminated sufficiently and the film forming chamber is kept at a sufficiently high vacuum, for example at about $10^{-4}$ torr or less, or preferably about $10^{-8}$ torr or less. The material gas can be supplied from the cylinder to the film forming chamber by using an inert gas such as helium (He) or argon (Ar). In the process, water vapor (H$_2$O) gas is supplied to the film forming chamber. The supply of the material gas and water vapor gas is appropriately adjusted in the range of about 1 to 1000 SCCM. The pressure in the film forming chamber is usually kept at about $10^{-4}$ to $10^3$ torr, preferably 10 torr.

The temperature in the film forming chamber is usually kept at about 300° to 400° C., preferably about 400° C. In the process, the temperature of the substrate can be appropriately adjusted with the decomposition temperature of the material gas used therein. It is usually kept at 400° C. or less, preferably about 100° to 200° C.

A semiconductive device can be manufactured by forming a desired element and wiring on a titanium thin film formed by the method described above.

Table 1 shows supplying temperature and vapor pressure of the organic titanium compounds having an aliphatic alkoxide or aliphatic diketone which are used for material gas of the present invention as a ligand.

TABLE 1

| Material | Vapor pressure | Supplying temperature |
|---|---|---|
| Titanium isopropoxide | 49° C./0.1 mmHg | 30–60° C. |
| Titanium 2,2,6,6-tetramethyl-3,5-heptadione | — | 100–150° C. |

As shown in Table 1, since the titanium alkoxide or the organic titanium compounds having an aliphatic diketone as a ligand have relatively high vapor pressure, material gas can be supplied at low temperature, for example, at 150° C. or less.

In the process of the CVD method of the present invention, vapor gas is introduced into a reaction chamber to react with the titanium alkoxide or the organic titanium compounds having an aliphatic diketone as a ligand, followed by subliming aliphatic alcohol or aliphatic diketone generated by the reaction, thereby eliminating impurities such as organic compounds from the titanium thin film.

Figure 1:
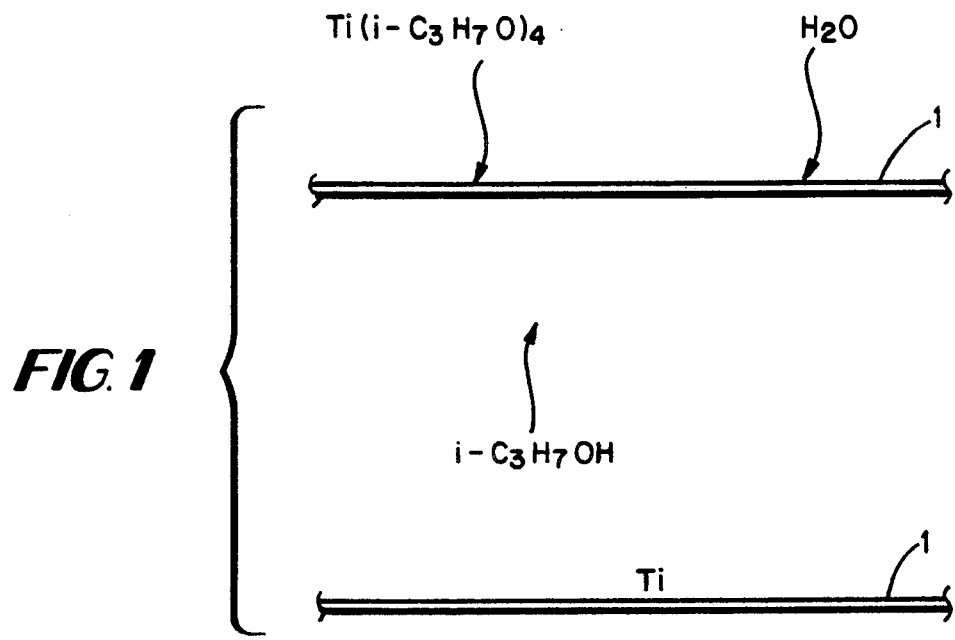
FIG. 1 is an explanatory view for forming a titanium thin film of the present invention.

According to the method of the present invention, a titanium thin film is formed on the substrate by CVD method using the titanium alkoxide or the organic titanium compounds having an aliphatic diketone as a ligand with vapor gas. Namely, material gas is reacted with vapor gas while keeping the substrate 1 on which the titanium thin film is formed at a temperature higher than the decomposition temperature of the titanium alkoxide or the organic titanium compounds having an aliphatic diketone as a ligand that is used for material gas (see FIG. 1). The material gas heated to the decomposition temperature in the vicinity of the substrate 1 is reacted with vapor gas. Then, titanium atoms are released to the substrate 1 and organic compounds generated by the reaction is sublimed. Consequently, a titanium thin film with good coverage and less impurities can be formed at low temperature.

EXAMPLES

Examples of the method for manufacturing a semiconductor device according to the present invention will be detailed.

Initially a silicon substrate 1 was employed as a substrate for forming a titanium thin film. On the silicon substrate 1 was formed a 1.4 μm thick interlayer insulating film in which a contact hole with a 0.4 μm diameter extending over to the substrate was provided. The silicon substrate 1 was placed on a sample holding device 4 in the CVD apparatus 10 to start forming films.

EXAMPLE 1

A cylinder 5 containing titanium isopropoxide used as the material gas 6 was kept at about 50° C. in a constant temperature tank 9 while reducing the pressure in the cylinder 5 to about 1 Torr, thereby giving an appropriate vapor pressure. A second inlet pipe 8 through which the material gas 6 passes was kept at about 60° C. from the cylinder 5 to the film forming chamber 2. Then, to prevent decomposition and absorbency in portions other than the film forming chamber 2, Argon (Ar) gas was allowed to enter into the cylinder 5 to convey material gas 6 to the film forming chamber 2 with it. The film forming chamber 2 was previously kept in a high vacuum condition of about $10^{-8}$ Torr while sufficiently exhausting unnecessary elements such as oxygen and the like. The silicon substrate 1 placed in the film forming chamber 2 was heated to about 200° C. Then, water vapor gas was supplied into the film forming chamber 2 from the first inlet pipe 7. The flow rate of each gas was controlled to 100 SCCM so as to keep the pressure in the film forming chamber 2 to about 10 Torr.

Titanium isopropoxide used as the material gas was reacted with water vapor on the heated silicon substrate 1 to give propanol and the propanol was sublimed. In this way, the titanium thin film was formed on the silicon substrate 1 with good coverage and with only a small amount of impurities.

Table 2 shows a coverage of titanium thin film of the present invention formed by thermal CVD apparatus and plasma CVD apparatus using the titanium alkoxide or the organic titanium compound having an aliphatic diketone as a ligand. As a comparative example, the coverage of titanium thin films formed by conventional sputtering method is also listed in Table 2.

TABLE 2

|  | Film | Coverage (%) |
|---|---|---|
| Example | plasma CVD-TiN | 20 |
|  | thermal CVD-TiN | 100 |
|  | thermal CVD-W | 98 |
| Comparative example | sputter-Ti | 7 |
|  | sputter-TiN | 5 |

Figure 3:
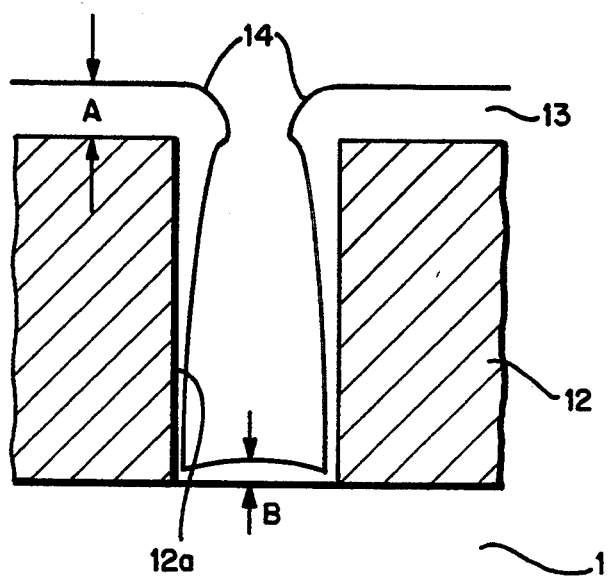
FIG. 3 is a schematic cross sectional view showing a conventional titanium thin film.
Figure 4:
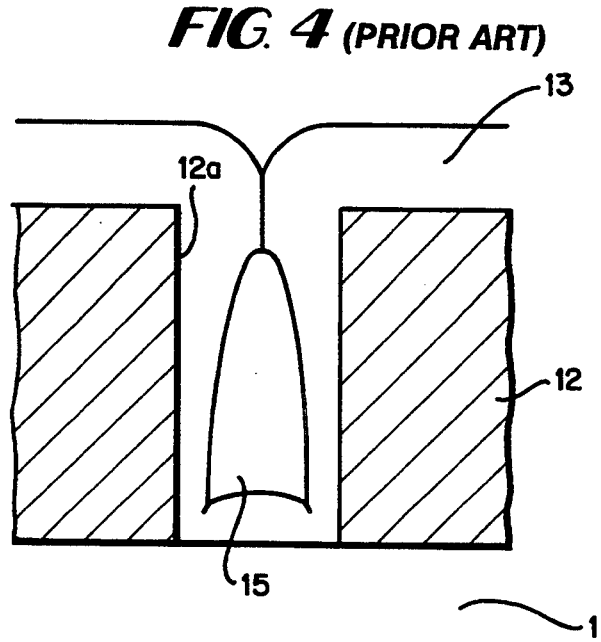
FIG. 4 is a schematic cross sectional view showing another conventional titanium thin film.

Table 2 clearly shows that the method for forming a titanium thin film according to the present invention provides the titanium thin film with good coverage. The coverage was calculated as a percentage obtained by dividing the thickness of the titanium thin film on the bottom of the contact hole by the thickness of the titanium thin film formed on the inter layer film (shown by B/A in FIG. 3).

According to the method of the present invention, the titanium thin film is formed with good coverage, only a small amount of impurities and at low temperature by using the titanium alkoxide or the organic titanium compounds having an aliphatic diketone as a ligand.

Namely, in the presence of vapor gas, material gas is reacted with vapor gas while keeping the substrate 1 on which the titanium thin film is formed at a temperature higher than the decomposition temperature of the titanium alkoxide or the organic titanium compounds having an aliphatic diketone as a ligand that is used for material gas. The material gas heated to the decomposition temperature in the vicinity of the substrate 1 is reacted with vapor gas. Then, titanium atoms are deposited to the substrate 1 and organic compounds generated by the reaction is sublimed, thereby forming the titanium thin film with good coverage and less impurities.

Further, the titanium alkoxide or the organic titanium compounds having an aliphatic diketone as a ligand are relatively stable and easy to treat. In addition, the organic titanium compounds of the present invention have relatively high vapor pressure, so that the material gas can be supplied at low temperature.

Thus, the titanium thin film is formed with good coverage and only a few amount of impurities at low temperature by the method of the present invention.

What we claimed is:

1. A method for producing a titanium thin film comprising:
    forming the titanium thin film on a substrate in the presence of water vapor gas by CVD method which uses a material gas containing an organic titanium compound having an aliphatic alkoxide or an aliphatic diketone as a ligand.

2. The method for producing titanium thin film according to claim 1, wherein the substrate has desired elements and an interlayer insulating film or has desired elements and an interlayer insulating film thereon and further a contact hole in the interlayer insulating film.

3. The method for producing titanium thin film according to claim 1, wherein the water vapor gas is supplied in the range of about 1 to 1000 SCCM.

4. The method for producing titanium thin film according to claim 1, wherein the material gas is supplied in the range of about 1 to 1000 SCCM.

5. The method for producing titanium thin film according to claim 1, wherein the material gas is titanium isopropoxide, titanium ethoxide, titanium n-butoxide, titanium t-butoxide or an organic titanium compound having an aliphatic diketone as a ligand selected from the group consisted of acethylacetone, 2,2,6,6-tetramethyl-3,5-heptandione, 3,3,7,7-tetraethyl- 4,6-nonanedione, 3-methyl-2,4-pentandione, 3-ethyl-2,4-pentandione, 2,2,4,6,6-pentamethyl-3,5-heptandione, 2,2,6,6-tetramethyl-4-ethyl-3,5-heptandione, 3,3,5,7,7-pentaethyl-4,6-nonanedione 3,3,7,7-tetraethyl-5-methyl-4,6-nonanedione, acetonitrile acetone, 2,6-heptandione.

6. The method for producing titanium thin film according to claim 1, wherein the material gas is titanium isopropoxide or titanium 2,2,6,6-tetramethyl-3,5-heptandione.

* * * * *